United States Patent
Hung et al.

(10) Patent No.: US 6,855,598 B2
(45) Date of Patent: Feb. 15, 2005

(54) FLASH MEMORY CELL INCLUDING TWO FLOATING GATES AND AN ERASING GATE

(75) Inventors: Chih-Wei Hung, Hsin-Chu (TW); Cheng-Yuan Hsu, Hsin-Chu (TW); Da Sung, Hsin-Chu (TW); Chien-Chih Du, Hsin-Chu (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 25 days.

(21) Appl. No.: 10/249,059

(22) Filed: Mar. 13, 2003

(65) Prior Publication Data

US 2004/0180495 A1 Sep. 16, 2004

(51) Int. Cl.⁷ .............................................. H01L 21/336
(52) U.S. Cl. ........................ 438/257; 438/211; 257/315
(58) Field of Search ......................................... 257/314

(56) References Cited

U.S. PATENT DOCUMENTS 6,503,785 B2 * 1/2003 Chen ........................... 438/211
2004/0057286 A1 * 3/2004 Chen et al. .............. 365/185.17
2004/0065917 A1 * 4/2004 Fan et al. ..................... 257/315

* cited by examiner

Primary Examiner—David Nelms
Assistant Examiner—Thao P. Le
(74) Attorney, Agent, or Firm—Winston Hsu (57) ABSTRACT

A flash memory includes a substrate, at least a source and two drains formed in the substrate, and the source located between the drains, two tunnel oxide layers formed on the substrate between each drain and the source, a floating gate formed on each of the tunnel oxide layers, a plurality of first oxide layers formed aside each of the floating gates, a dielectric layer formed on each of the floating gates, a control gate formed on each of the dielectric layers, a plurality of second oxide layers formed on surfaces of the control gates and extending toward both sides of the control gates, a lateral width of each second oxide layer being larger than a lateral width of each oxide layer, a third oxide layer formed on the source, and an erasing gate formed on the third oxide layer and located between the floating gates.

6 Claims, 14 Drawing Sheets

FLASH MEMORY CELL INCLUDING TWO FLOATING GATES AND AN ERASING GATE

BACKGROUND OF INVENTION

1. Field of the Invention

The present invention relates to a flash memory and method of fabrication, and more particularly, to an electron tunnel oxide (ETOX) flash memory and method of fabricating the same.

2. Description of the Prior Art

Figure 1:
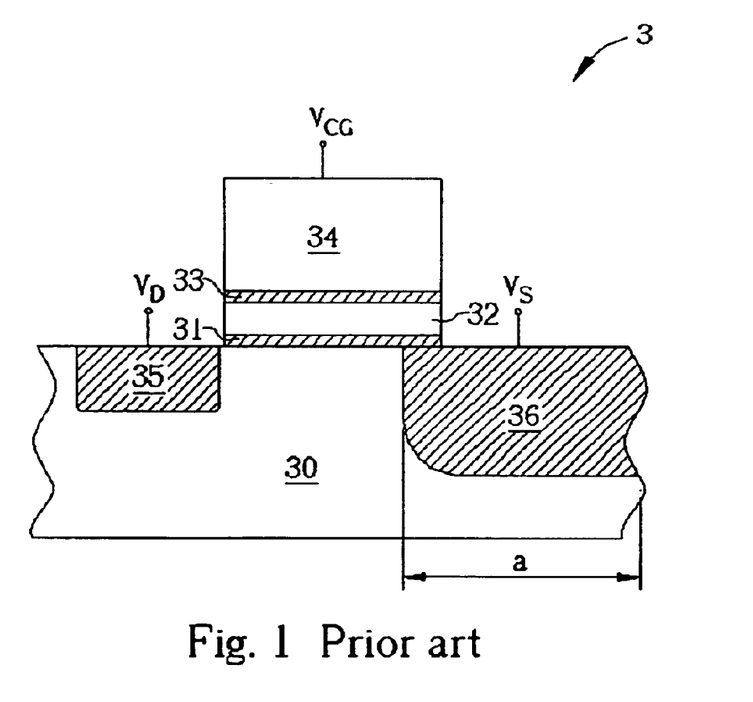
FIG. 1 is a cross-sectional view illustrating a conventional flash memory cell.

Please refer to FIG. 1, which is a cross-sectional view illustrating a conventional flash memory cell 3. As shown in FIG. 1, the method of fabricating the conventional flash memory cell 3 is to first form a tunnel oxide layer 31, a floating gate layer 32, a dielectric layer 33, and a control gate layer 34 on a substrate 30 in sequence. Then a photolithography process is performed to form a stacked gate by utilizing a mask. An ion implantation process is thereafter performed to form a source 36 and a drain 35 in the substrate 30.

When the flash memory cell 3 is working, a voltage level of 10–12V needs to be applied to the source 36. In order to sustain such a high voltage, the junction of the source 36 and the substrate 30 should be a deep junction. According to the diffusion theory, a lateral width (sector a) of the source 36 is large. Therefore a band to band tunneling phenomenon occurs when the above-mentioned high voltage is applied to the source 36. In other words, holes readily flow into the floating gate layer 32 when the above-mentioned high voltage is applied to the source 36, leading to the degradation of the tunnel oxide layer 31. The deep junction also results in leakage current flowing into the substrate 30 and increases the impedance of the power supply. In addition, the unit area of the flash memory cell 3 is unable to be shrunk because of the large lateral width of the source 36, providing limitation to miniaturizing.

Figure 2:
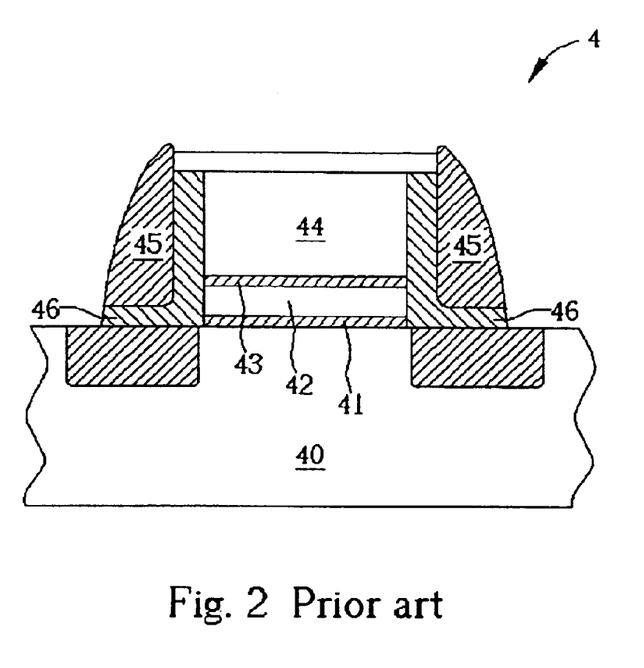
FIG. 2 is a cross-sectional view illustrating another conventional flash memory cell.

Please refer to FIG. 2, which is a cross-sectional view illustrating another conventional flash memory cell 4. As shown in FIG. 2, the method of fabricating the conventional flash memory cell 4 is to first form a tunnel oxide layer 41, a floating gate layer 42, a dielectric layer 43, and a control gate layer 44 on a substrate 40 in sequence. Then a photolithography process is performed to form a stacked gate by utilizing a mask. After that, deposition and etching processes are performed to form a polysilicon spacer 45 (an erasing gate layer) at either side of the stacked gate. The polysilicon spacer 45 is separate from the stacked gate and the substrate 40 with an erasing oxide layer 46 in between.

During an erasing operation of the flash memory cell 4, electrons flow from the floating gate layer 42 to the polysilicon spacer 45 (the erasing gate layer) through the erasing oxide layer 46. At this time, the voltage level applied to the erasing gate layer 45 is usually increased to higher than 15V to discharge the electrons in the floating gate layer 42 by utilizing the potential difference between the erasing gate layer 45 and the floating gate layer 42. According to the prior art method, the erasing oxide layer 46 is formed by a deposition process and thus has a uniform thickness. If the easing oxide layer 46 is too thick, electrons cannot flow through the erasing oxide layer 46 to affect the erasing performance; if the erasing oxide layer 46 is too thin, a breakdown phenomenon is incurred to cause the flash memory cell 4 to not work properly.

It is therefore very important to develop a flash memory and method of fabrication to resolve the above-mentioned problems.

SUMMARY OF INVENTION

It is therefore a primary objective of the claimed invention to provide a flash memory to avoid the band to band tunneling phenomenon, the increased leakage current phenomenon, and the breakdown phenomenon and to shrink the area of the flash memory.

It is another object of the claimed invention to provide a method of fabricating a flash memory.

According to the claimed invention, the claimed flash memory comprises a substrate, two tunnel oxide layers, two floating gates, a plurality of first oxide layers, two dielectric layers, two control gates, a plurality of second oxide layers, a third oxide layer, and an erasing gate. The substrate comprises at least two drains and a source located between the drains; the tunnel oxide layers are formed on the substrate between each drain and the source; one floating gate is formed on each of the tunnel oxide layers; the first oxide layers are formed aside each of the floating gates; one dielectric layer is formed on each of the floating gates; one control gate is formed on each of the dielectric layers; the second oxide layers are formed on surfaces of the control gates and extend toward both sides of the control gates, the third oxide layer is formed on the source; and the erasing gate is formed on the third oxide layer and located between the floating gates. A lateral width of each second oxide layer is larger than a lateral width of each first oxide layer.

According to the claimed invention, the method of forming the claimed flash memory comprises: forming a tunnel oxide layer, a floating gate layer, and a dielectric layer from bottom to top on a substrate in sequence; forming a control gate layer on the dielectric layer; etching the control gate layer to form two control gates; oxidizing the control gates to form a plurality of second oxide layers on surfaces of the control gates and aside the control gates; etching the dielectric layer and the floating gate layer by utilizing the second oxide layers as a mask to form a floating gate underneath each of the control gates; implanting ions into the substrate to form a source between the floating gates; oxidizing the floating gates and the substrate to form a plurality of first oxide layers aside the floating gates and forming a third oxide layer on a surface of the source, a lateral width of each second oxide layer being larger than a lateral width of each first oxide layer; and forming an erasing gate on the third oxide layer.

The claimed invention provides a flash memory and a method of fabrication. The claimed invention flash memory is characterized with a unique structure to resolve the above-mentioned problems frequently occurring in the prior art flash memory. In contrast to the prior art flash memory, the junction of the source and the substrate in the claimed invention flash memory does not need to be a deep junction so that the phenomena of band to band tunneling and increased leakage current are avoided. Moreover, the unit area of the flash memory cell can be shrunk to miniaturize the flash memory. Since the lateral width of the second oxide layers is larger than the lateral width of the first oxide layers in the claimed invention flash memory cell, the leakage current flowing from the control gates to the erasing gate is very small during the erasing operation. The problems of insufficient erasing gate voltage and improper erasing operation are therefore avoided.

These and other objectives of the present invention will no doubt become obvious to those of ordinary skill in the art after reading the following detailed description of the preferred embodiment that is illustrated in the various FIGS. and drawings.

DETAILED DESCRIPTION

The following descriptions illustrating a flash memory and method of fabricating the same according to the present invention refer to the drawings. The same components use the same reference symbols.

Figure 3:
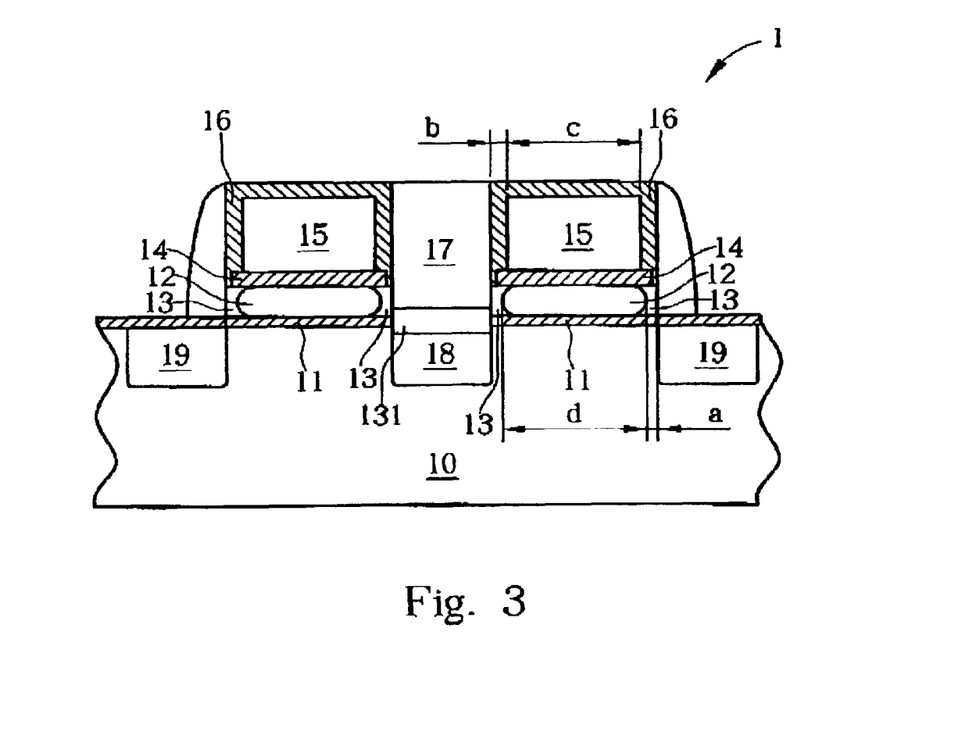
FIG. 3 is a cross-sectional view illustrating a flash memory cell according to a first preferred embodiment of the present invention.

Please refer to FIG. 3. FIG. 3 is a cross-sectional view illustrating a flash memory cell 1 according to a first preferred embodiment of the present invention. As shown in FIG. 3, the present invention flash memory 1 comprises a substrate 10, two tunnel oxide layers 11, two floating gates 12, a plurality of first oxide layers 13, two dielectric layers 14, two control gates 15, two second oxide layers 16, a third oxide layer 131, and an erasing gate 17.

In the first preferred embodiment of the present invention, at least three doped regions, including a source 18 and two drains 19, are formed in the substrate 10. The source 18 is located between the drains 19. The tunnel oxide layers 11 are formed on the substrate 10 and between each drain 19 and the source 18. The floating gate 12 is formed on each of the tunnel oxide layers 11. The first oxide layers 13 are formed aside each of the floating gates 12. The dielectric layer 14 is formed on each of the floating gates 12. The control gate 15 is formed on each of the dielectric layers 14. The second oxide layers 16 are formed on surfaces of the control gates 15 and extend toward both sides of the control gates 15. A lateral width of each second oxide layer 16 (sector b) is larger than a lateral width of each first oxide layer (sector a). The third oxide layer 131 is formed on the source 18. The erasing gate layer 17 is formed on the third oxide layer 131 located between the floating gates 12.

In the first preferred embodiment of the present invention, the substrate 10 is a silicon substrate. The tunnel oxide layers 11 are formed by a thermal oxidation process or a rapid-thermal oxidation process, and the thickness of each tunnel oxide layer 11 is approximately 90 Å. The material composition of each floating gate 12, having a thickness of approximately 200 Å, is polysilicon. During a writing operation of the flash memory cell 1, electrons flow from the sources 18 into the channel, then hop up from the channel and are stored in the floating gates 12.

The first oxide layers 13 are formed aside each of the floating gates 12. The material composition of each first oxide layer 13 is inter-polysilicon oxide (IPO). The first oxide layers 13 are formed aside each of the floating gates 12 by performing an oxidation process at a temperature of 850° C. The lateral width of each first oxide layer 13 (sector a) is approximately 200 Å. The third oxide layer 131 and the first oxide layers 13 are formed simultaneously. Since the third oxide layer 131 is formed on a surface of the source 18, which had been implanted with ions, the thickness of the third oxide layer 131 is larger than the thickness of the first oxide layer 13.

The material composition of each oxide layer 14 is oxide/nitride/oxide (ONO). The dielectric layer 14 is formed by depositing a first-layered silicon dioxide layer (40 Å), a silicon nitride layer (60 Å), and a second-layered silicon dioxide layer (60 Å) sequentially. As shown in FIG. 3, the material composition of each control gate 15 is doped polysilicon. A lateral width of each control gate 15 (sector c) is smaller than a lateral width of the floating gate (sector d). The second oxide layers 16 are formed on surfaces of the control gates 15 and extend toward both sides of the control gates 15. The second oxide layers 16 are formed on surfaces of the control gates 15 and extend toward both sides of the control gates 15 by performing an oxidation process at a temperature of 850° C. The lateral width of each second oxide layer 16 (sector b) is approximately 500 Å to 800 Å.

Because the lateral width of each second oxide layer 16 (sector b) is larger than the lateral width of each first oxide layer 13 (sector a), electrons in the control gates 15 will not flow into the erasing gate 17 through the second oxide layers 16 during an erasing operation of the flash memory cell 1. Therefore, the problems of insufficient erasing gate voltage and improper erasing operation are avoided.

Figure 4:
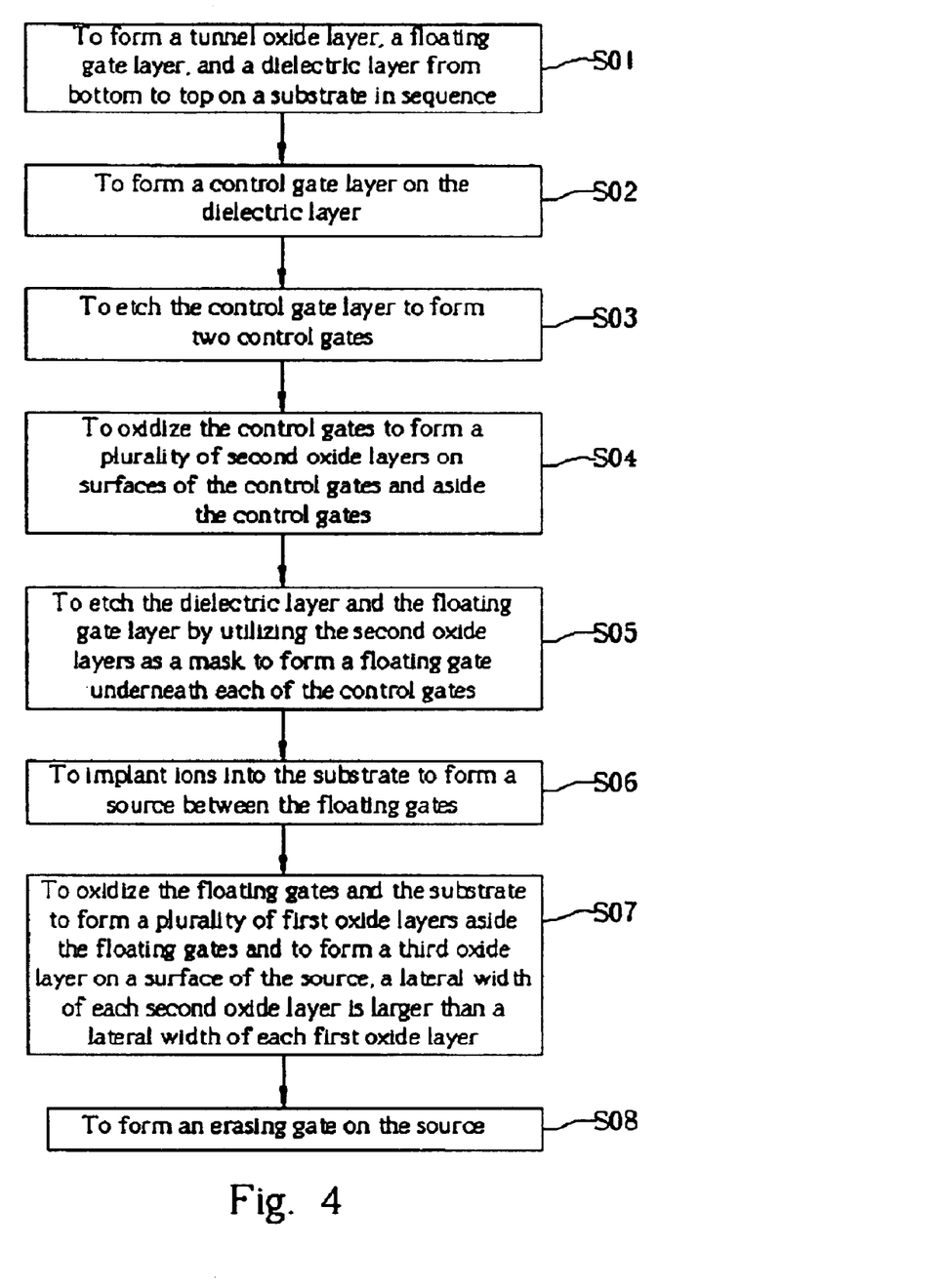
FIG. 4 is a flow chart illustrating a method of fabricating a flash memory cell according to a second preferred embodiment of the present invention.

Please refer to FIG. 4. FIG. 4 is a flow chart illustrating a method of fabricating a flash memory cell according to a second preferred embodiment of the present invention. As shown in FIG. 4, the method comprises the following process steps: form a tunnel oxide layer, a floating gate layer, and a dielectric layer from bottom to top on a substrate in sequence (S01); form a control gate layer on the dielectric layer (S02); etch the control gate layer to form two control gates (S03); oxidize the control gates to form a plurality of second oxide layers on surfaces of the control gates and aside the control gates (S04); etch the dielectric layer and the floating gate layer by utilizing the second oxide layers as a mask to form a floating gate underneath each of the control gates (S05); implant ions into the substrate to form a source between the floating gates (S06); oxidize the floating gates and the substrate to form a plurality of first oxide layers aside the floating gates and to form a third oxide layer on a surface of the source, a lateral width of each second oxide layer is larger than a lateral width of each first oxide layer (S07); and form an erasing gate on the third oxide layer (S08).

Figure 5A:
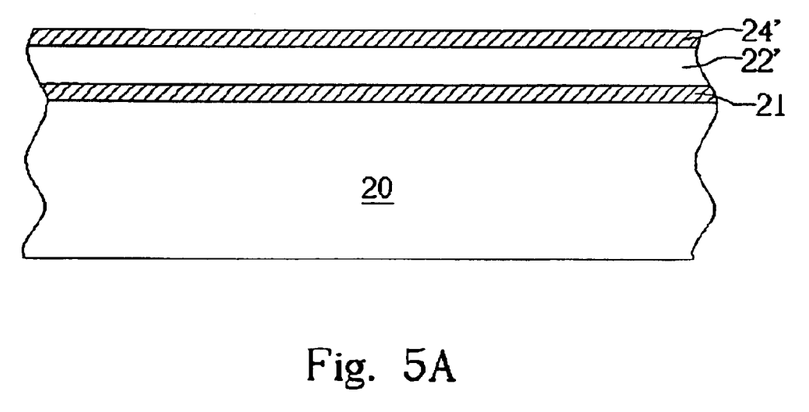
FIGS. 5A to 5H are cross-sectional views illustrating a method of fabricating a flash memory cell according to the second preferred embodiment of the present invention.
Figure 5B:
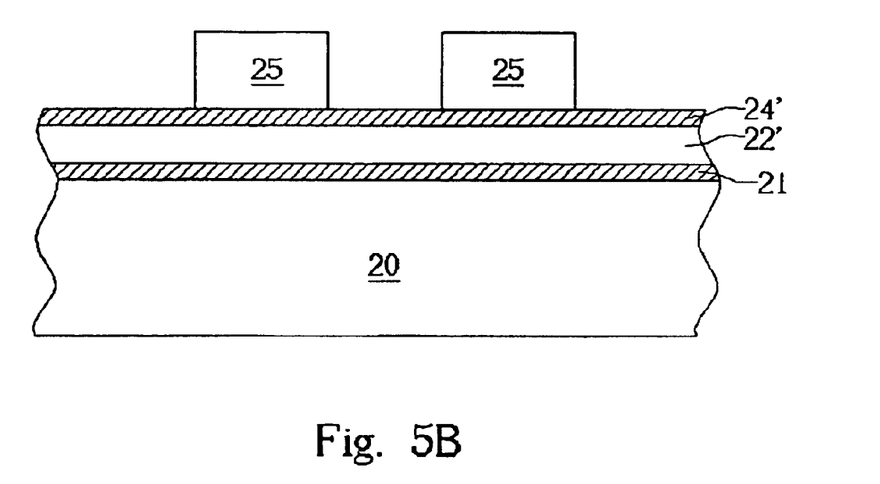

Please refer to FIGS. 5A to 5H. FIGS. 5A to 5H are cross-sectional views illustrating a method of fabricating a flash memory cell according to the second preferred embodiment of the present invention. A tunnel oxide layer 21, a floating gate layer 22", and a dielectric layer 24" are formed from bottom to top on a substrate 20 in sequence in process step 501, as shown in FIG. 5A. Then a polysilicon layer is deposited on the dielectric layer 24" in process step S02. A photo/etching process is thereafter performed to form two control gates 25 in process step S03, as shown in FIG. 5B.

Figure 5C:
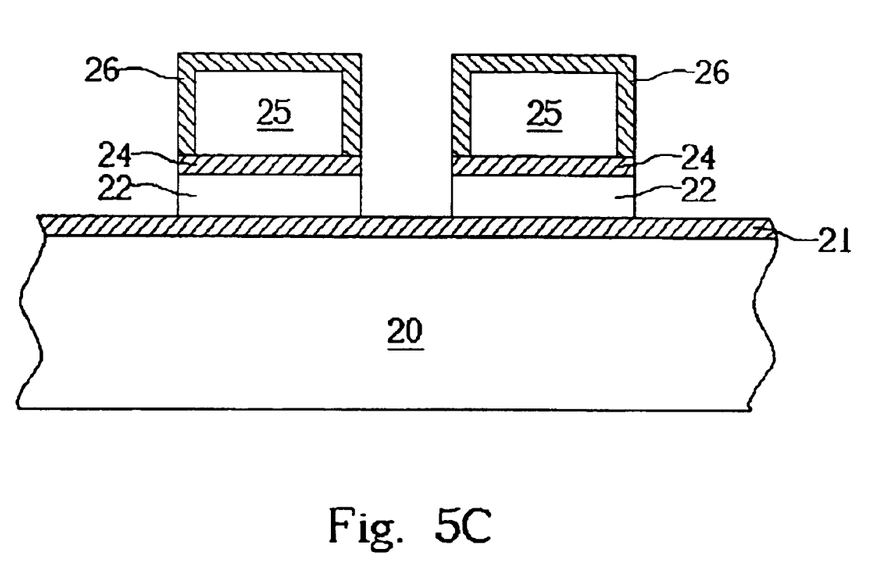
Figure 5D:
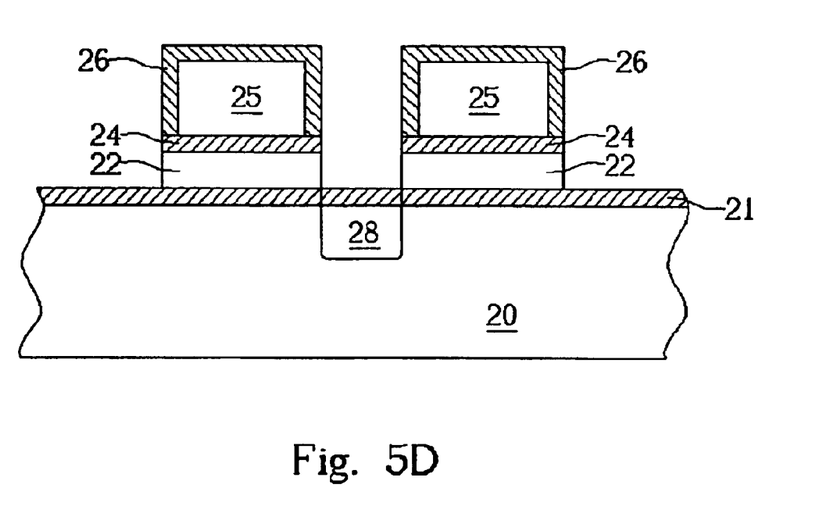

A plurality of second oxide layers 26 are formed on surfaces of the control gates 25 and aside the control gates 25 by performing an oxidation process at a temperature of 850° C. in process step S04. A self-align etching process is performed to etch the dielectric layer 24" and the floating gate layer 22" and stop on the top of the tunnel oxide layer 21" by utilizing the second oxide layers 26 as a mask in process step S05. A dielectric layer 24 and a floating gate 22 are thus formed underneath each of the control gates 25, as shown in FIG. 5C. An ion implantation process is performed on the substrate 20 to form a source 28 between the floating gates 22 in process step S06, as shown in FIG. 5D.

Figure 5E:
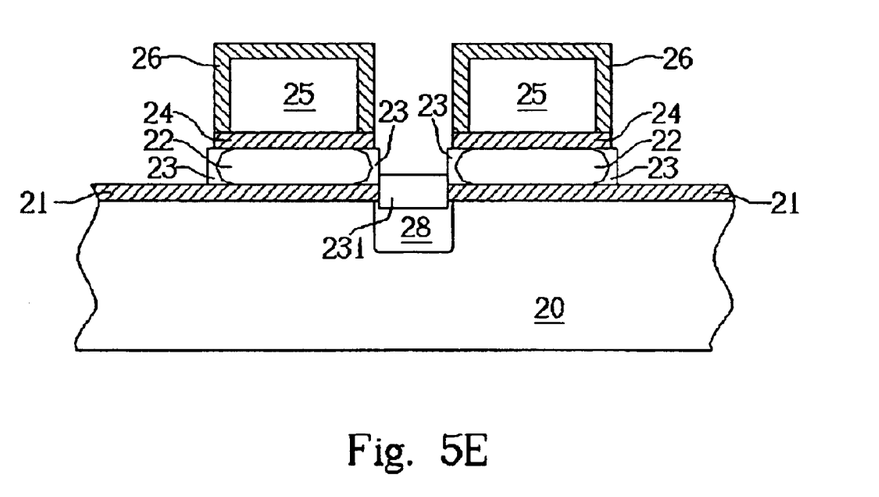

An oxidation process is performed to form a plurality of first oxide layers 23 aside the floating gates 22 and to form a third oxide layer 231 on a surface of the source 28 at a temperature of 850° C. in process step S07, as shown in FIG. 5E. A lateral width of each second oxide layer 26 is larger than a lateral width of each first oxide layer 23. It is worth noticing that a shape of a lateral cross section of the floating gates 22 is originally a rectangle (shown in FIG. 5D). During the oxidation process in process step S07, the corner portions of the floating gates 22 tend to be oxidized more quickly so that the shape of the lateral cross section of the floating gates 22 becomes as what is shown in FIG. 5E. Relatively, a shape of a lateral cross section of the first oxide layers 23, aside each of the floating gates 22, is thick on top and thin in the middle.

During an erasing operation of the flash memory cell 2, electrons in each of the floating gates 22 are erased through the thinnest portions of the first oxide layers 23. When performing the oxidation process in process step S07, the thickness of the third oxide layer 231 on the source 28 is larger than the thickness of the first oxide layer 23 because the source 28 had been implanted with ions. Generally speaking, the thickness of the third oxide layer 231 is approximately 2–3 times as large as the thickness of the first oxide layer 23. The third oxide layer 231 is for use as an isolation layer between the source 28 and the subsequent formed erasing gate.

Figure 5F:
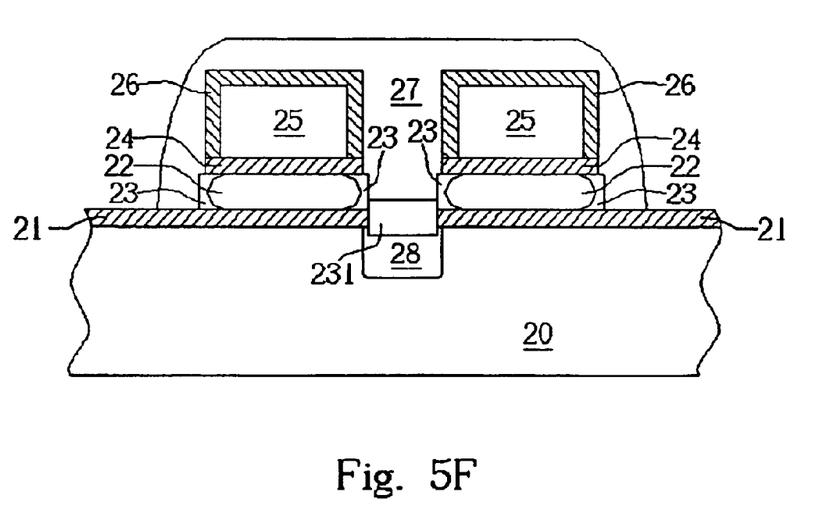
Figure 5G:
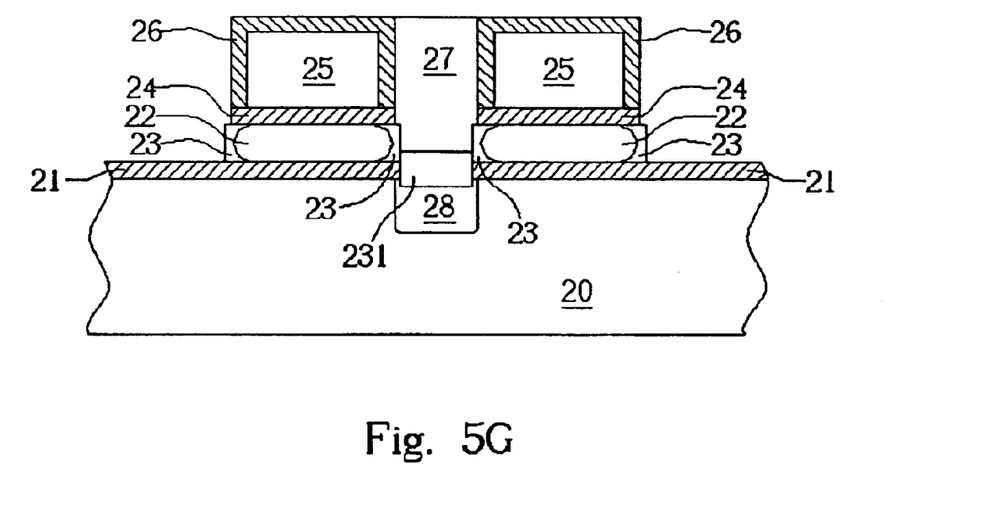
Figure 5H:
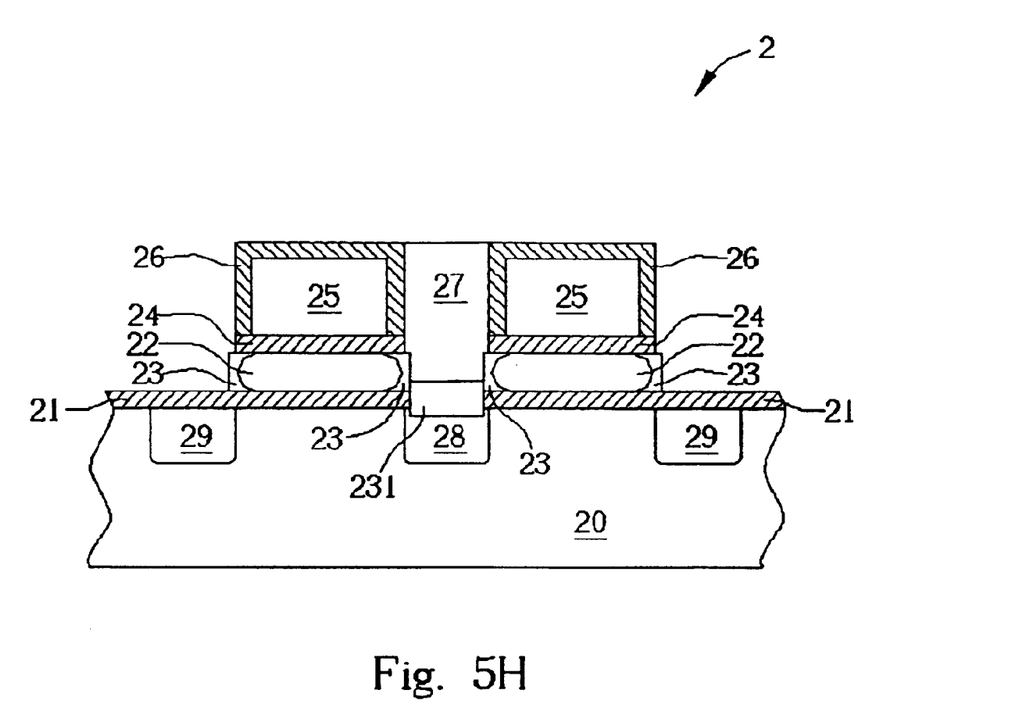

After that, another polysilicon layer is deposited on the third oxide layer 231 so that an erasing gate 27 is formed afterwards in process step S08, as shown in FIG. 5F. An etching back process is then performed after forming the erasing gates 27, as shown in FIG. 5G. Ions are thereafter implanted into the substrate 20 after the etching back process to form two drains 29 as shown in FIG. 5H. The source 28 is located between the drains 29.

During a reading operation of the flash memory cell 2, a voltage level of 3.3V is applied to the control gates 25, the source 28 and the substrate 20 are grounded (0V), and a voltage level of 1.5V is applied to the drains 29.

Figure 6:
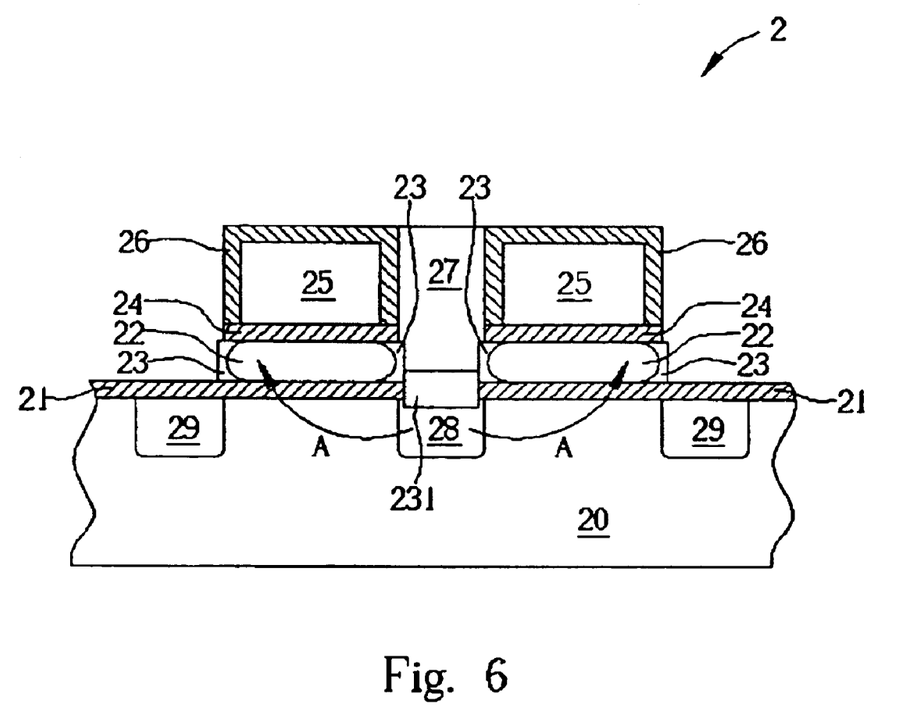
FIG. 6 is a cross-sectional view illustrating a writing operation of the flash memory cell according to the second preferred embodiment of the present invention.

Please refer to FIG. 6. FIG. 6 is a cross-sectional view illustrating a writing operation of the flash memory cell 2 according to the second preferred embodiment of the present invention. During a writing operation of the flash memory cell 2, a voltage level of 10–12V is applied to the control gates 25, the source 28 is grounded (0V), and a voltage level of 5–6V is applied to the drains 29. Due to the hot carrier injection mechanism, electrons in the source 28 move to the floating gates 22 (follow the direction of arrows A) and are stored in the floating gates 22.

Figure 7:
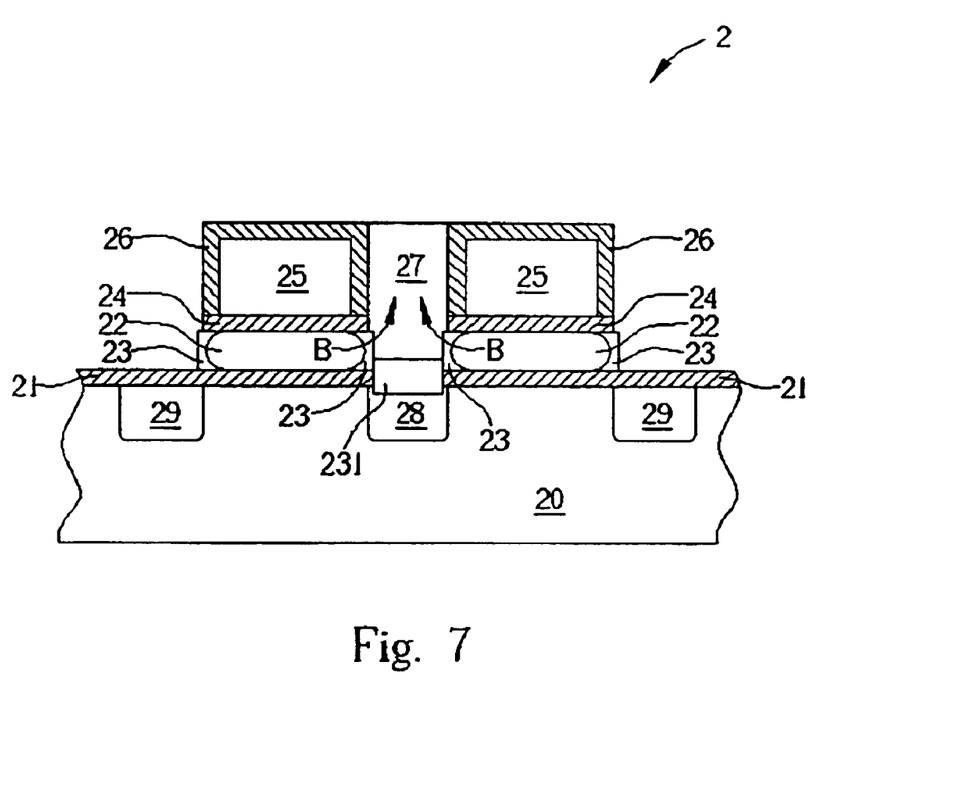
FIG. 7 is a cross-sectional view illustrating an erasing operation of the flash memory cell according to the second preferred embodiment of the present invention.

Please refer to FIG. 7. FIG. 7 is a cross-sectional view illustrating an erasing operation of the flash memory cell 2 according to the second preferred embodiment of the present invention. During an erasing operation of the flash memory cell 2, the control gates 25 are grounded (0V), a voltage level of 12V is applied to the erasing gate 27, and the substrate 20 is grounded (0V). That means, the source 28, the drains 29, and the control gates 25 are all grounded (0V). Electrons in the floating gates 22 thus move to the erasing gate 27 (follow the direction of arrows B) to complete the erasing operation. It is worth noticing that those skilled in the art may utilize other operational conditions to control the potential difference between the erasing gate 27 and the control gates 25 so as to fulfill the erasing operation. For example, a voltage level of 6–8V may be applied to the erasing gate 27, a voltage level of −10V may be applied to the control gates 25, and the source 28 and the drains 29 may be grounded (0V). Under these circumstances, electrons in the floating gates 22 will also move to the erasing gate 27 (follow the direction of arrows B) to complete the erasing operation.

The features and the functions of the components disclosed in this preferred embodiment, which are the same as the components disclosed in the flash memory cell 1, are not stated superfluously and redundantly.

In comparison with the conventional flash memory, the present invention provides a flash memory and a method of fabrication. In the present invention flash memory, the high voltage is applied to the erasing gate rather than the source so that the junction of the source and the substrate does not need to be a deep junction, avoiding the phenomena of band to band tunneling and increased leakage current. Furthermore, the unit area of the flash memory cell can be shrunk so as to miniaturize the flash memory because the deep junction is not necessary. In addition, since the lateral width of the second oxide layers is larger than the lateral width of the first oxide layers in the present invention flash memory cell, electrons in the control gates will not flow into the erasing gate through the second oxide layers during the erasing operation. Therefore, the problems of insufficient erasing gate voltage and improper erasing operation are avoided.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A flash memory cell comprising:
   a substrate, at least a source and two drains formed in the substrate, and the source located between the drains;
   two tunnel oxide layers formed on the substrate between each drain and the source;
   two floating gates, wherein each of the two floating gates is formed on each of the tunnel oxide layers respectively;
   a plurality of first oxide layers formed aside each of the floating gates;
   two dielectric layers, wherein each of the two dielectric layers is formed on each of the floating gates respectively;
   two control gates, wherein each of the two control gates is formed on each of the dielectric layers respectively;
   a plurality of second oxide layers formed on surfaces of the control gates and extending toward both sides of the control gates, a lateral width of each second oxide layer being larger than a lateral width of each first oxide layer;
   a third oxide layer formed on the source; and
   an erasing gate formed on the third oxide layer and located between the two floating gates of the flash memory cell, the erasing gate drawing electrons from either of the two floating gates of the flash memory cell in an erasing operation.

2. The flash memory cell of claim 1, wherein the substrate is a silicon substrate.

3. The flash memory cell of claim 1, wherein the lateral width of the first oxide layer is approximately 200 Å.

4. The flash memory cell of claim 1, wherein the lateral width of the second oxide layer is approximately 500 Å to 800 Å.

5. The flash memory cell of claim 1, wherein the lateral width of the control gate is smaller than the lateral width of the floating gate.

6. The flash memory cell of claim 1, wherein a shape of a lateral cross section of the floating gate is thin on top and bottom and thick in the middle, and a shape of a lateral cross section of the first oxide layer is thick on top and bottom and thin in the middle.

* * * * *